United States Patent
Iwamoto

(10) Patent No.: US 11,843,362 B2
(45) Date of Patent: *Dec. 12, 2023

(54) ELASTIC WAVE DEVICE, HIGH-FREQUENCY FRONT-END CIRCUIT, AND COMMUNICATION DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/944,240

(22) Filed: Sep. 14, 2022

(65) Prior Publication Data

US 2023/0006638 A1    Jan. 5, 2023

Related U.S. Application Data

(63) Continuation of application No. 16/583,511, filed on Sep. 26, 2019, now Pat. No. 11,482,983, which is a (Continued)

(30) Foreign Application Priority Data

Sep. 10, 2015    (JP) .................. 2015-178650

(51) Int. Cl.
*H03H 9/05*    (2006.01)
*H03H 9/02*    (2006.01)
(Continued)

(52) U.S. Cl.
CPC ........ *H03H 9/058* (2013.01); *H03H 9/02566* (2013.01); *H03H 9/02574* (2013.01);
(Continued)

(58) Field of Classification Search
CPC ............... H03H 9/058; H03H 9/02566; H03H 9/02574; H03H 9/05; H03H 9/145; H03H 9/25; H03H 9/72; H03H 9/02866
(Continued)

(56) References Cited

U.S. PATENT DOCUMENTS 7,105,980 B2 *  9/2006  Abbott ............... H03H 9/02094
                                                              310/313 R
10,469,052 B2 * 11/2019 Iwamoto .................. H03H 9/05
(Continued)

OTHER PUBLICATIONS

Iwamoto, "Elastic Wave Device, High-Frequency Front-End Circuit, and Communication Device", U.S. Appl. No. 16/583,511, filed Sep. 26, 2019.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An elastic wave device includes a support substrate made of silicon, a piezoelectric film disposed directly or indirectly on the support substrate, and an interdigital transducer electrode disposed on one surface of the piezoelectric film. A higher-order mode acoustic velocity of propagation through the piezoelectric film is equal or substantially equal to an acoustic velocity $V_{si}=(V_1)^{1/2}$ of propagation through silicon or higher than the acoustic velocity $V_{si}$, where $V_{si}$ is specified by $V_1$ among solutions $V_1$, $V_2$, and $V_3$ with respect to x derived from $Ax^3+Bx^2+Cx+D=0$.

14 Claims, 5 Drawing Sheets

Related U.S. Application Data continuation of application No. 15/879,468, filed on Jan. 25, 2018, now Pat. No. 10,469,052, which is a continuation of application No. PCT/JP2016/075526, filed on Aug. 31, 2016.

(51) Int. Cl.
*H03H 9/72* (2006.01)
*H03H 9/145* (2006.01)
*H03H 9/25* (2006.01)

(52) U.S. Cl.
CPC ............ *H03H 9/05* (2013.01); *H03H 9/145* (2013.01); *H03H 9/25* (2013.01); *H03H 9/72* (2013.01)

(58) Field of Classification Search
USPC ........................................ 333/133, 193–196
See application file for complete search history.

(56) References Cited

U.S. PATENT DOCUMENTS

| | | | | |
|---|---|---|---|---|
| 11,482,983 | B2* | 10/2022 | Iwamoto | H03H 9/02866 |
| 2004/0246077 | A1* | 12/2004 | Misu | H03H 7/1766 |
| | | | | 333/195 |
| 2013/0285768 | A1* | 10/2013 | Watanabe | H10N 30/01 |
| | | | | 333/193 |

* cited by examiner

ELASTIC WAVE DEVICE, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2015-178650 filed on Sep. 10, 2015 and is a Continuation Application of PCT Application No. PCT/JP2016/075526 filed on Aug. 31, 2016. The entire contents of each application are hereby incorporated herein by reference.

BACKGROUND OF THE INVENTION

1. Field of the Invention

The present invention relates to an elastic wave device including a support substrate made of silicon and to a high-frequency front-end circuit and a communication device including the same.

2. Description of the Related Art

Various elastic wave devices in which a silicon plate is used as a support substrate have been proposed. For example, Japanese Unexamined Patent Application Publication No. 11-55070 discloses an elastic wave device in which a $SiO_2$ film, a $LiTaO_3$ film, and an interdigital transducer electrode are stacked in this order on a silicon substrate. According to Japanese Unexamined Patent Application Publication No. 11-55070, the film thickness of the $LiTaO_3$ film is about $1\lambda$, where the wavelength of an elastic wave is assumed to be $\lambda$.

Regarding the elastic wave device described in Japanese Unexamined Patent Application Publication No. 11-55070, a higher-order mode response may be relatively significant depending on the crystal orientation state of the silicon substrate.

SUMMARY OF THE INVENTION

Preferred embodiments of the present invention provide elastic wave devices, high-frequency front-end circuits, and communication devices in which a higher-order mode response is effectively reduced or prevented.

An elastic wave device according to a preferred embodiment of the present invention includes a support substrate made of silicon, a piezoelectric film disposed directly or indirectly on the support substrate, and an interdigital transducer electrode disposed on one surface of the piezoelectric film, wherein a higher-order mode acoustic velocity of propagation through the piezoelectric film is equal or substantially equal to the acoustic velocity $V_{si}$ denoted by formula (1) described below or higher than the acoustic velocity $V_{si}$.

$$V_{si} = (V_1)^{1/2} \text{ (m/sec)} \qquad \text{formula (1)}$$

In formula (1), $V_1$ is the solution to formula (2) described below.

$$Ax^3 + Bx^2 + Cx + D = 0 \qquad \text{formula (2)}$$

In formula (2), A, B, C, and D are values denoted by formulae (2A) to (2D), respectively, described below.

$$A = -\rho^3 \qquad \text{formula (2A)}$$

$$B = \rho^2(L_{11} + L_{22} + L_{33}) \qquad \text{formula (2B)}$$

$$C = \rho(L_{21}^2 + L_{23}^2 + L_{31}^2 - L_{11} \cdot L_{33} - L_{22} \cdot L_{33} - L_{11} \cdot L_{22}) \qquad \text{formula (2C)}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \qquad \text{formula (2D)}$$

In each of formula (2A), formula (2B), formula (2C), and formula (2D), $\rho$ represents the density (g/cm$^3$) of silicon and $L_{11}$, $L_{22}$, $L_{33}$, $L_{21}$, $L_{31}$, and $L_{23}$ are values denoted by formulae (3A) to (3F), respectively, described below.

$$L_{11} = c_{11} \cdot a_1^2 + c_{44} \cdot a_2^2 + c_{44} \cdot a_3^2 \qquad \text{formula (3A)}$$

$$L_{22} = c_{44} \cdot a_1^2 + c_{11} \cdot a_2^2 + c_{44} \cdot a_3^2 \qquad \text{formula (3B)}$$

$$L_{33} = c_{44} \cdot a_1^2 + c_{44} \cdot a_2^2 + c_{11} \cdot a_3^2 \qquad \text{formula (3C)}$$

$$L_{21} = (c_{12} + c_{44}) \cdot a_2 \cdot a_1 \qquad \text{formula (3D)}$$

$$L_{31} = (c_{12} + c_{44}) \cdot a_1 \cdot a_3 \qquad \text{formula (3E)}$$

$$L_{23} = (c_{44} + c_{12}) \cdot a_3 \cdot a_2 \qquad \text{formula (3F)}$$

In the formulae (3A) to (3F), each of $c_{11}$, $c_{12}$, and $c_{44}$ is an elastic constant (N/m$^2$) of silicon, and $a_1$, $a_2$, and $a_3$ are values denoted by formulae (4A) to (4C), respectively, described below.

$$a_1 = \cos(\phi) \cdot \cos(\varphi) - \sin(\phi) \cdot \cos(\theta) \cdot \sin(\varphi) \qquad \text{formula (4A)}$$

$$a_2 = \sin(\phi) \cdot \cos(\varphi) + \cos(\phi) \cdot \cos(\theta) \cdot \sin(\varphi) \qquad \text{formula (4B)}$$

$$a_3 = \sin(\theta) \cdot \sin(\varphi) \qquad \text{formula (4C)}$$

In the formulae (4A) to (4C), $\phi$, $\theta$, and $\varphi$ represent $\phi$, $\theta$, and $\varphi$ in the crystal orientation $(\phi, \theta, \varphi)$ of silicon.

In an elastic wave device according to a preferred embodiment of the present invention, $V_1$ in formula (1) is the solution with the lowest value among the solutions $V_1$, $V_2$, and $V_3$ with respect to formula (2) described above.

In an elastic wave device according to a preferred embodiment of the present invention, the piezoelectric film is made of $LiTaO_3$. In this case, a main mode response has high Q and, further, a higher-order mode response is reduced or prevented.

In an elastic wave device according to a preferred embodiment of the present invention, the film thickness of the piezoelectric film made of $LiTaO_3$ is within the range of about $0.05\lambda$ or more and about $3.5\lambda$ or less, where the wavelength of the elastic wave, which is determined in accordance with the electrode finger pitch of the interdigital transducer electrode, is $\lambda$. In this case, a higher-order mode response is more effectively reduced or prevented. More preferably, the film thickness of the piezoelectric film made of $LiTaO_3$ is about $1.5\lambda$ or less. In this case, a higher-order mode response is also more effectively reduced or prevented. Further preferably, the film thickness of the piezoelectric film made of $LiTaO_3$ is about $0.5\lambda$ or less. In this case, a higher-order mode response is also more effectively reduced or prevented and, in addition, the Q of a main mode response is more improved.

In an elastic wave device according to a preferred embodiment of the present invention, a dielectric film stacked between the support substrate and the piezoelectric film is further included.

In an elastic wave device according to a preferred embodiment of the present invention, the dielectric film is made of silicon oxide. In this case, the absolute value of the temperature coefficient of resonant frequency TCF is reduced.

In an elastic wave device according to a preferred embodiment of the present invention, the film thickness of the dielectric film made of silicon oxide is about 1.2λ or less, where the wavelength of the elastic wave, which is determined in accordance with the electrode finger pitch of the interdigital transducer electrode, is λ. In this case, a higher-order mode response is more effectively reduced or prevented. More preferably, the film thickness of the dielectric film made of silicon oxide is about 0.6λ or less, where the wavelength of the elastic wave, which is determined in accordance with the electrode finger pitch of the interdigital transducer electrode, is λ. In this case, a higher-order mode response is also more effectively reduced or prevented.

In an elastic wave device according to a preferred embodiment of the present invention, a high acoustic velocity film, which is disposed between the support substrate and the piezoelectric film and through which a bulk wave propagates at an acoustic velocity higher than the acoustic velocity of an elastic wave that propagates through the piezoelectric film, and a low acoustic velocity film, which is stacked on the high acoustic velocity film and through which a bulk wave propagates at an acoustic velocity lower than the acoustic velocity of an elastic wave that propagates through the piezoelectric film, are further provided.

A high-frequency front-end circuit according to a preferred embodiment of the present invention includes the elastic wave device according to a preferred embodiment of the present invention and a power amplifier.

A communication device according to a preferred embodiment of the present invention includes the high-frequency front-end circuit, an RF signal processing circuit, and a base band signal processing circuit.

In elastic wave devices according to preferred embodiments of the present invention, a higher-order mode response is effectively reduced or prevented by selecting a silicon crystal orientation $(\phi,\theta,\varphi)$ in which the acoustic velocity through the support substrate made of silicon is lower than or equal to the higher-order mode acoustic velocity. In high-frequency front-end circuits and communication devices according to preferred embodiments of the present invention, a higher-order mode response is effectively reduced or prevented by using the above-described elastic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The preferred embodiments according to the present invention will be described below with reference to the drawings so as to clarify the present invention.

It is indicated that each of the preferred embodiments described in the present specification is an exemplification and the configuration may be partly replaced or combined with the configuration of other preferred embodiments.

Figure 1A:
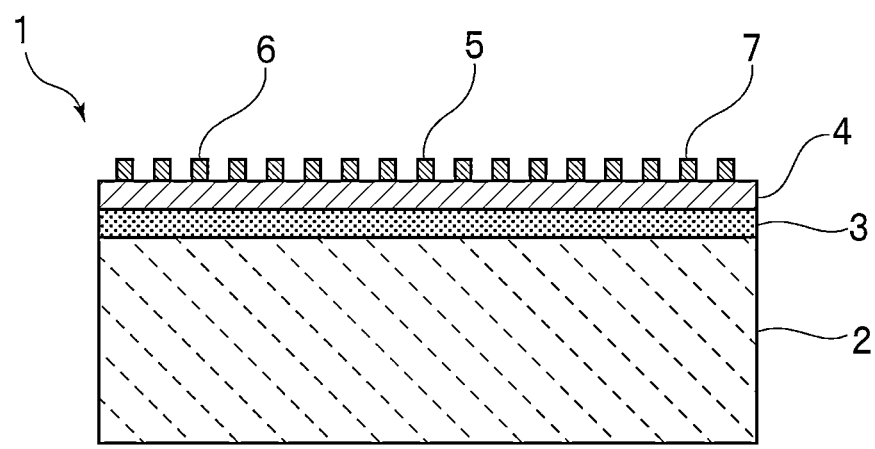
FIG. 1A is a sectional front view showing an elastic wave device according to a preferred embodiment of the present invention.

FIG. 1A is a sectional front view showing an elastic wave device according to a preferred embodiment of the present invention. An elastic wave device 1 includes a support substrate 2 made of silicon. A $SiO_2$ film 3 is preferably stacked on the support substrate 2. A film made of a dielectric other than silicon oxide may be used as a dielectric film.

Figure 1B:
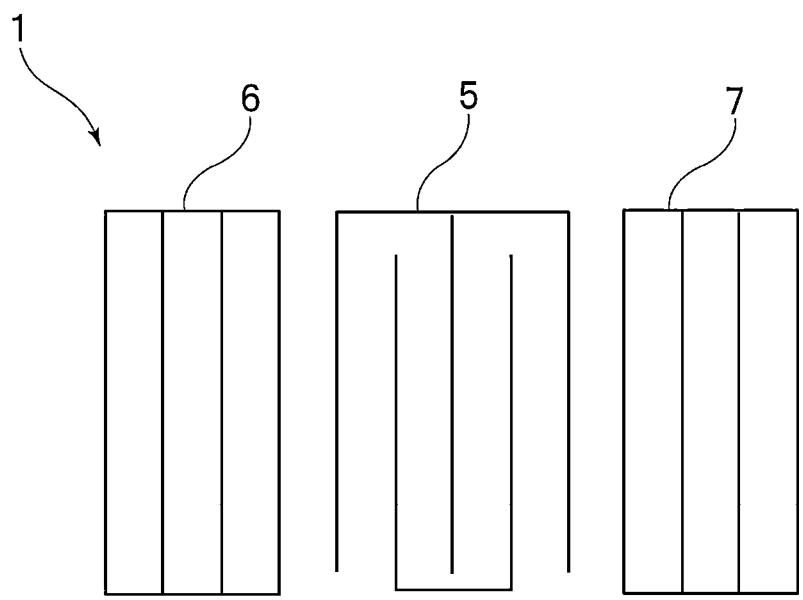
FIG. 1B is a schematic plan view showing an electrode structure of an elastic wave device according to a preferred embodiment of the present invention.

A $LiTaO_3$ film 4 defining a piezoelectric film is stacked on the $SiO_2$ film 3. That is, the $LiTaO_3$ film 4 is disposed indirectly on the support substrate 2. An interdigital transducer electrode 5 and reflectors 6 and 7 are disposed on the $LiTaO_3$ film 4. As shown in FIG. 1B, the electrode structure of the elastic wave device 1 includes the interdigital transducer electrode 5 and the reflectors 6 and 7. The elastic wave device 1 is preferably a one-port elastic wave resonator, for example.

The interdigital transducer electrode 5 is preferably disposed on the upper surface of the $LiTaO_3$ film 4 but may be disposed on the lower surface.

The dielectric film may be disposed on the interdigital transducer electrode 5.

Preferred embodiments of the present invention were developed by the inventor based on a new discovery that a higher-order mode response increased when the acoustic velocity through the support substrate made of silicon became higher than a higher-order mode acoustic velocity and that a higher-order mode response decreased when the acoustic velocity through the support substrate became lower than or equal to a higher-order mode acoustic velocity.

In this regard, the acoustic velocity through the support substrate made of silicon is denoted by formulae (1) to (4C) described below, and the value of the acoustic velocity changes in accordance with the value of the crystal orientation $(\phi,\theta,\varphi)$ of silicon.

$$V_{si}=(V_1)^{1/2} \text{ (m/sec)} \quad \text{formula (1)}$$

In formula (1), $V_1$ is the solution to formula (2) described below.

$$Ax^3+Bx^2+Cx+D=0 \quad \text{formula (2)}$$

In formula (2), A, B, C, and D are values denoted by formulae (2A) to (2D), respectively, described below.

$$A=-\rho^3 \quad \text{formula (2A)}$$

$$B=\rho^2(L_{11}+L_{22}+L_{33}) \quad \text{formula (2B)}$$

$$C = \rho(L_{21}{}^2 + L_{23}{}^2 + L_{31}{}^2 - L_{11} \cdot L_{33} - L_{22} \cdot L_{33} - L_{11} \cdot L_{22}) \quad \text{formula (2C)}$$

$$D = 2 \cdot L_{21} \cdot L_{23} \cdot L_{31} + L_{11} \cdot L_{22} \cdot L_{33} - L_{31}{}^2 \cdot L_{22} - L_{11} \cdot L_{23}{}^2 - L_{21}{}^2 \cdot L_{33} \quad \text{formula (2D)}$$

In each of formula (2A), formula (2B), formula (2C), and formula (2D), $\rho$ represents the density (g/cm³) of silicon, and $L_{11}$, $L_{22}$, $L_{33}$, $L_{21}$, $L_{31}$, and $L_{23}$ are values denoted by formulae (3A) to (3F), respectively, described below.

$$L_{11} = c_{11} \cdot a_1{}^2 + c_{44} \cdot a_2{}^2 + c_{44} \cdot a_3{}^2 \quad \text{formula (3A)}$$

$$L_{22} = c_{44} \cdot a_1{}^2 + c_{11} \cdot a_2{}^2 + c_{44} \cdot a_3{}^2 \quad \text{formula (3B)}$$

$$L_{33} = c_{44} \cdot a_1{}^2 + c_{44} \cdot a_2{}^2 + c_{11} \cdot a_3{}^2 \quad \text{formula (3C)}$$

$$L_{21} = (c_{12} + c_{44}) \cdot a_2 \cdot a_1 \quad \text{formula (3D)}$$

$$L_{31} = (c_{12} + c_{44}) \cdot a_1 \cdot a_3 \quad \text{formula (3E)}$$

$$L_{23} = (c_{44} + c_{12}) \cdot a_3 \cdot a_2 \quad \text{formula (3F)}$$

In the formulae (3A) to (3F), each of $c_{11}$, $c_{12}$, and $c_{44}$ is an elastic constant (N/m²) of Si (silicon), and $a_1$, $a_2$, and $a_3$ are values denoted by formulae (4A) to (4C), respectively, described below.

$$a_1 = \cos(\phi) \cdot \cos(\varphi) - \sin(\phi) \cdot \cos(\theta) \cdot \sin(\varphi) \quad \text{formula (4A)}$$

$$a_2 = \sin(\phi) \cdot \cos(\varphi) + \cos(\phi) \cdot \cos(\theta) \cdot \sin(\varphi) \quad \text{formula (4B)}$$

$$a_3 = \sin(\theta) \cdot \sin(\varphi) \quad \text{formula (4C)}$$

In the formulae (4A) to (4C), $\phi$, $\theta$, and $\varphi$ represent $\phi$, $\theta$, and $\varphi$ in the crystal orientation $(\phi, \theta, \varphi)$ of silicon.

Then, a higher-order mode response is effectively reduced or prevented by selecting the value of a silicon crystal orientation $(\phi, \theta, \varphi)$ such that a higher-order mode acoustic velocity of propagation through the piezoelectric film becomes equal or substantially equal to the acoustic velocity $V_{si}$ through the support substrate made of silicon or higher than the acoustic velocity $V_{si}$ through the support substrate made of silicon.

A further feature of the elastic wave device 1 is that the higher-order mode acoustic velocity of propagation through the LiTaO₃ film 4 is preferably set to be equal or substantially equal to a slow transverse wave acoustic velocity $V_{si}$ denoted by $V_{si} = (V_1)^{1/2}$ or to be higher than the acoustic velocity $V_{si}$, where the solution with the lowest value among the solutions $V_1$, $V_2$, and $V_3$ ($V_1 \leq V_2 \leq V_3$) with respect to x that satisfies formula (2) described above is assumed to be $V_1$. The slow transverse wave acoustic velocity $V_{si}$ of propagation through silicon is $(V_1)^{1/2}$ (m/sec).

Consequently, a higher-order mode response is more effectively reduced or prevented.

Figure 3:
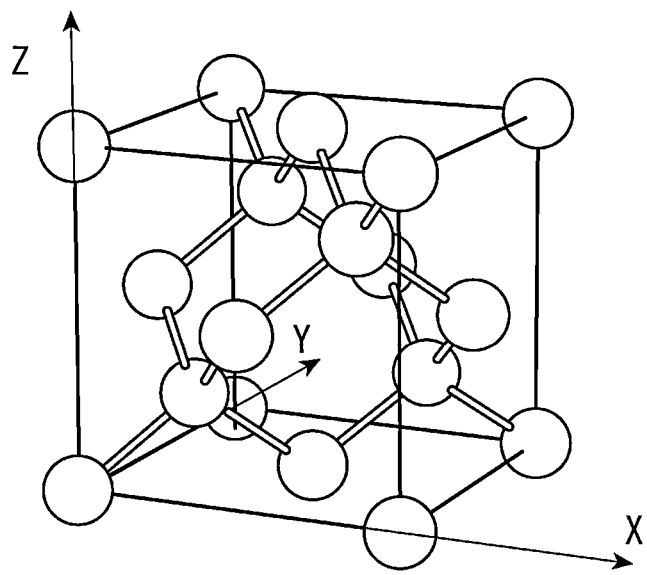
FIG. 3 is a schematic diagram illustrating the definition of the crystal orientation of Si.

The crystal orientation $(\phi, \theta, \varphi)$ of silicon will be described with reference to FIG. 3. FIG. 3 is a schematic diagram illustrating the definition of the crystal orientation of silicon. In the crystal structure of silicon shown in FIG. 3, when the rotational direction of a right-handed screw is assumed to be positive, the axis of rotation is set to be Z-X-Z. The crystal orientation $(\phi, \theta, \varphi)$ refers to an orientation obtained as a result of 1) rotating (X,Y,Z) by "$\phi$" about the Z-axis so as to obtain $(X_1, Y_1, Z_1)$, 2) rotating $(X_1, Y_1, Z_1)$ by "$\theta$" about the $X_1$-axis so as to obtain $(X_2, Y_2, Z_2)$, and 3) rotating $(X_2, Y_2, Z_2)$ by "$\varphi$" about the $Z_2$-axis so as to obtain $(X_3, Y_3, Z_3)$.

Figure 4:
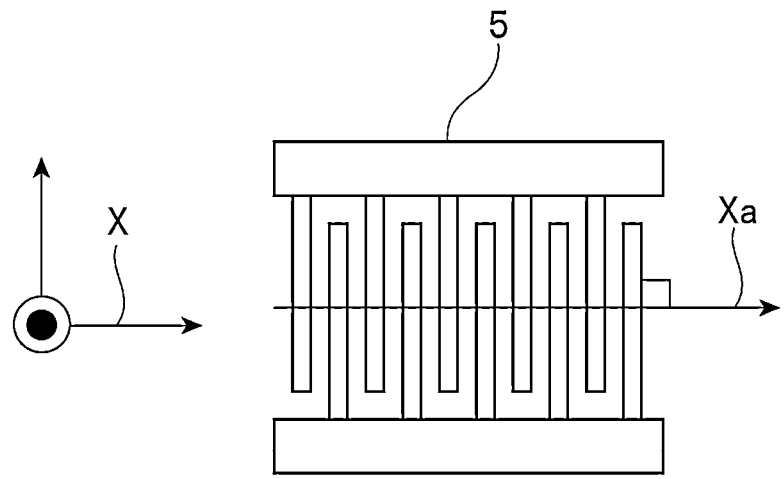
FIG. 4 is a schematic plan view showing the relationship between the X-axis of a Si crystal, where the crystal orientation $(\phi,\theta,\varphi)$ of Si=(0°,0°,0°), and the extension direction of electrode fingers of an interdigital transducer electrode.

As shown in FIG. 4, in the elastic wave device 1, when $(\phi, \theta, \varphi) = (0°, 0°, 0°)$, the X-axis of the Si crystal and a direction Xa orthogonal or substantially orthogonal to the extension direction of the interdigital transducer electrode 5 become the same direction.

Here, $V_{si}$ is calculated as the acoustic velocity of the slow transverse wave among silicon bulk waves that propagate in the Xa-direction.

When the crystal orientation $(\phi, \theta, \varphi)$ of silicon is, for example, $(30°, 54.7°, 45°)$, the acoustic velocity $V_{si}$ determined on the basis of formula (1) is 4,913 (m/sec).

The elastic constants $c_{11}$, $c_{12}$, and $c_{44}$ of Si are values defined as described below.

The strain S and the stress T of an elastic body are in a proportional relationship with each other. This proportional relationship is represented by the following matrix.

$$\begin{pmatrix} T_1 \\ T_2 \\ T_3 \\ T_4 \\ T_5 \\ T_6 \end{pmatrix} = \begin{pmatrix} c_{11} & c_{12} & c_{13} & c_{14} & c_{15} & c_{16} \\ c_{21} & c_{22} & c_{23} & c_{24} & c_{25} & c_{26} \\ c_{31} & c_{32} & c_{33} & c_{34} & c_{35} & c_{36} \\ c_{41} & c_{42} & c_{43} & c_{44} & c_{45} & c_{46} \\ c_{51} & c_{52} & c_{53} & c_{54} & c_{55} & c_{56} \\ c_{61} & c_{62} & c_{63} & c_{64} & c_{65} & c_{66} \end{pmatrix} \begin{pmatrix} S_1 \\ S_2 \\ S_3 \\ S_4 \\ S_5 \\ S_6 \end{pmatrix} \quad \text{Math. 1}$$

The proportionality constant ($c_{ij}$) of this formula is called an elastic constant. The elastic constant $c_{ij}$ is determined based on the crystal system to which a solid belongs. For example, regarding silicon, the elastic constant may be expressed by three independent values, as described below, because of the symmetry of the crystal.

Si Elastic Constant (N/m²)

$$\begin{bmatrix} c_{11} & c_{12} & c_{12} & 0 & 0 & 0 \\ c_{12} & c_{11} & c_{12} & 0 & 0 & 0 \\ c_{12} & c_{12} & c_{11} & 0 & 0 & 0 \\ 0 & 0 & 0 & c_{44} & 0 & 0 \\ 0 & 0 & 0 & 0 & c_{44} & 0 \\ 0 & 0 & 0 & 0 & 0 & c_{44} \end{bmatrix} \quad \text{Math. 2}$$

The above-described elastic constants $c_{11}$, $c_{12}$, and $c_{44}$ are elastic constants of Si defined as described above. The elastic constants of Si are $c_{11} = 1.674\text{E}+11$ (N/m²), $c_{12} = 6.523\text{E}+10$ (N/m²), and $c_{44} = 7.957\text{E}+10$ (N/m²) (H. J. McSkimin, et al., "Measurement of the Elastic Constants of Silicon Single Crystals and Their Thermal Constants", Phys. Rev. Vol. 83, p. 1080(L) (1951)). In addition, the density $\rho$ of silicon is 2,331 (g/cm³).

In the elastic wave device 1, the higher-order mode acoustic velocity is increased so as to become higher than or equal to the acoustic velocity $V_{si}$. Therefore, the higher-order mode is not confined within the portion in which the SiO₂ film 3 and the LiTaO₃ film 4 are stacked, and the higher-order mode leaks into the support substrate 2 made of Si. Consequently, a higher-order mode response is effectively reduced or prevented.

Figure 2:
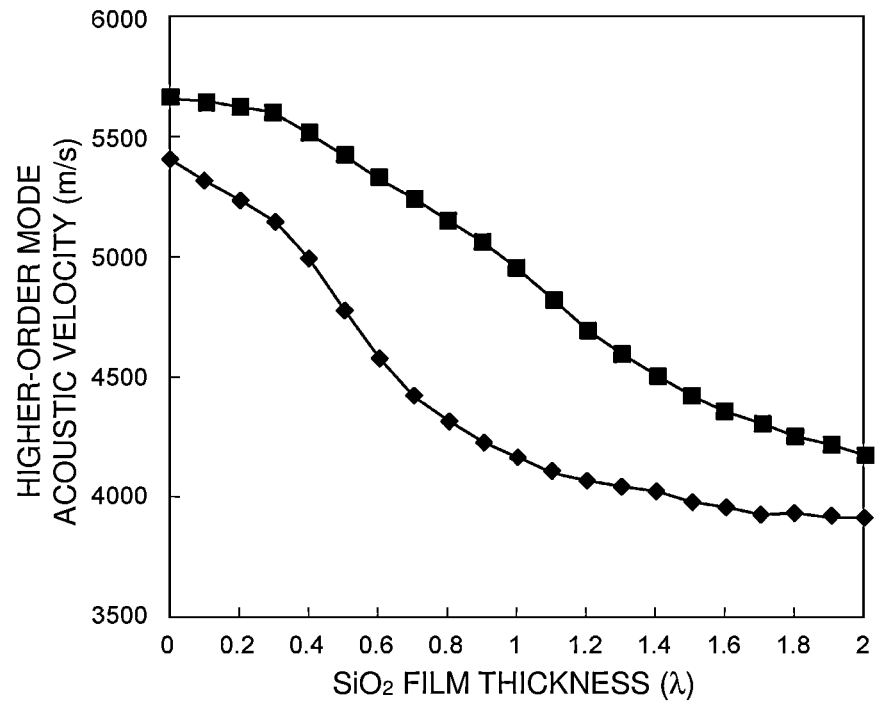
FIG. 2 is a diagram showing the relationship between the film thickness of a $SiO_2$ film and a higher-order mode acoustic velocity.

The higher-order mode acoustic velocity is able to be adjusted in accordance with the film thickness of the low acoustic velocity film, e.g., the SiO₂ film. FIG. 2 is a diagram showing the relationship between the film thickness of a SiO₂ film and a higher-order mode acoustic velocity. Square plots indicate the relationship between the SiO₂ film thickness and a second higher-order mode acoustic velocity, and rhombic plots indicate the relationship between the SiO₂ film thickness and a first higher-order mode acoustic velocity. Regarding the calculation conditions of FIG. 2, the LiTaO₃ film thickness was about 0.3λ, the cut angle was about 50° Y, the crystal orientation of Si was (0°,0°,0°), Al was used for the interdigital transducer electrode, the thickness was about 0.08λ, and the wavelength was about 1 µm. It was ascertained that the results shown in FIG. 2 did not significantly change in accordance with the LiTaO$_3$ film thickness, the cut angle, or the electrode thickness. That is, the higher-order mode acoustic velocity depends on the SiO$_2$ film thickness to a great extent. In FIG. 2, the first higher-order mode acoustic velocity and the second higher-order mode acoustic velocity are shown. It is clear that these two types of higher-order mode acoustic velocities change due to changes in the SiO$_2$ film thickness. As described above, the acoustic velocity through the Si substrate determined by formula (1) is 4,913 (m/sec) and, therefore, it is clear that the second higher-order mode acoustic velocity is reduced or prevented by setting the SiO$_2$ film thickness to be about 1.0λ or less, for example. In addition, it is clear that the first higher-order mode is also reduced or prevented by setting the SiO$_2$ film thickness to be about 0.4λ or less, for example. As a result, it is most preferable that the SiO$_2$ film thickness be about 0.4λ or less, for example, such that both the first higher-order mode and the second higher-order mode are able to be reduced or prevented.

When the crystal orientation of silicon is rotated in all directions, V$_{si}$ in the orientation in which V$_{si}$ is minimized is about 4,673 (m/sec), for example. According to FIG. 2, when the film thickness of the SiO$_2$ film 3 preferably is set to be about 1.2λ or less, for example, there are conditions under which the second higher-order mode is able to be reduced or prevented. Further, when the film thickness of the SiO$_2$ film 3 is set to be about 0.6λ or less, for example, there are conditions under which both the first higher-order mode and the second higher-order mode are able to be reduced or prevented at the same time and, thus, the higher-order mode is able to be further reduced or prevented.

In addition, in the elastic wave device 1, the thickness of the LiTaO$_3$ film 4 is preferably within the range of about 0.05λ or more and about 3.5λ or less, for example, where the wavelength of the elastic wave, which is determined in accordance with the electrode finger pitch of the interdigital transducer electrode 5, is λ. The film thickness is more preferably set to be about 1.5λ or less, and even more preferably to be about 0.5λ or less, for example.

This is because, although the higher-order mode tends to be confined to within the portion in which the SiO$_2$ film 3 and the LiTaO$_3$ film 4 are stacked, as described above, when a structure according to a preferred embodiment of the present invention is applied, the higher-order mode is not readily confined by setting the thickness of the LiTaO$_3$ film 4 to be within the above-described range so as to reduce the thickness of the stacking portion of the SiO$_2$ film 3 and the LiTaO$_3$ film 4.

An example of the elastic wave device according to the above-described preferred embodiment and an elastic wave device of a comparative example were produced. The design parameters were as described below.

An example of an elastic wave device according to a preferred embodiment includes a SiO$_2$ film 3 having a thickness of about 0.337λ, a LiTaO$_3$ film 4 having a thickness of about 0.300λ, an Al interdigital transducer electrode 5 having a thickness of about 0.08λ, and reflectors 6 and 7 disposed on a support substrate 2 composed of silicon with a crystal orientation of (45°,0°,0°), for example. The wavelength λ, which was determined in accordance with the electrode finger pitch of the interdigital transducer electrode was set to be about 1 μm. In the comparative example, an elastic wave device was produced in the same or similar manner as the above-described preferred embodiment except that the crystal orientation of silicon was set to be (0°,0°,0°).

In the above-described elastic wave device, the acoustic velocity through the support substrate 2 was about 4,673 (m/sec), a spurious first higher-order mode acoustic velocity was about 4,673 (m/sec), and a spurious second higher-order mode acoustic velocity was about 5,628 (m/sec), for example.

In the elastic wave device of the comparative example, the acoustic velocity through the support substrate was about 5,844 (m/sec), a first higher-order mode acoustic velocity was about 5,108 (m/sec), and a second higher-order mode acoustic velocity was about 5,588 (m/sec).

Figure 5:
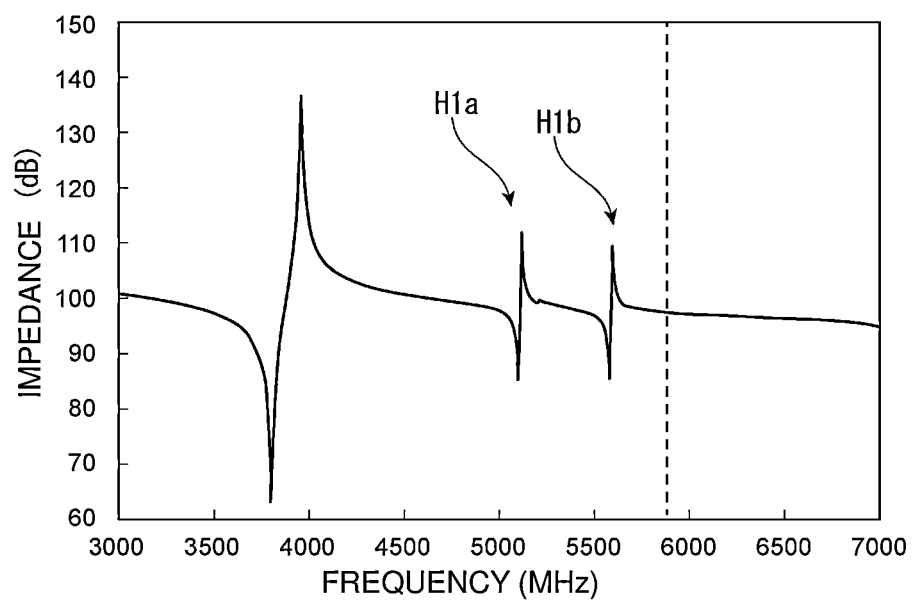
FIG. 5 is a diagram showing the impedance characteristics of an elastic wave device of a comparative example.
Figure 6:
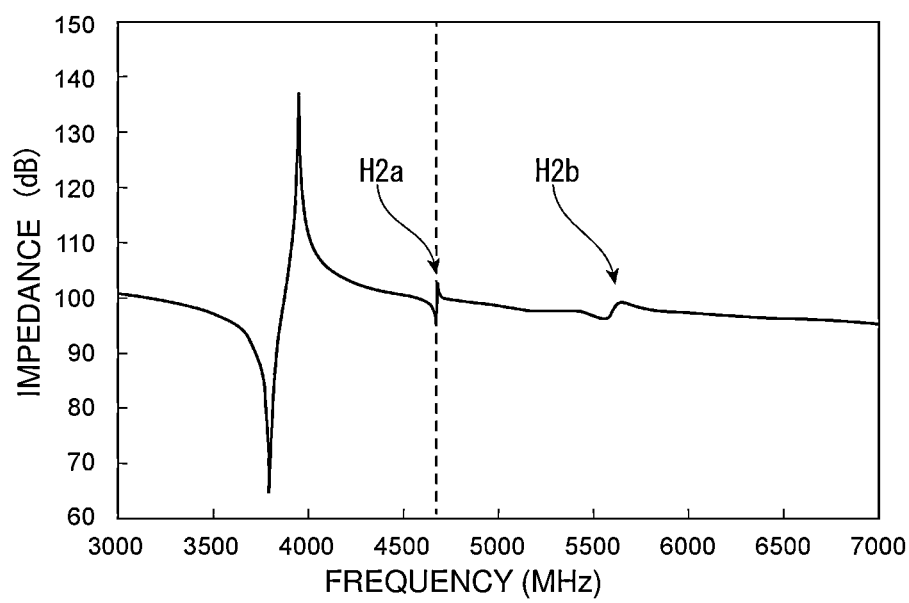
FIG. 6 is a diagram showing the impedance characteristics of an elastic wave device according to a preferred embodiment of the present invention.

FIG. 5 shows the impedance characteristics of the elastic wave device of the comparative example. FIG. 6 shows the impedance characteristics of an elastic wave device as an example of the above-described preferred embodiments. In this regard, dotted lines in FIG. 5 and FIG. 6 indicate the acoustic velocities through the support substrates composed of silicon.

In FIG. 5, higher-order mode responses indicated by arrows H1a and H1b appear to a great extent, whereas regarding the impedance characteristics shown in FIG. 6, higher-order mode responses appear to a very small extent, as shown by arrows H2a and H2b.

As described above, in the elastic wave device 1 according to the present preferred embodiment, the higher-order mode acoustic velocities are set to be higher than the acoustic velocity through the support substrate and, therefore, higher-order mode responses are effectively reduced or prevented.

In order to set the higher-order mode acoustic velocity to be higher than the acoustic velocity through the support substrate made of silicon, as described above, the film thickness of the low acoustic velocity film, e.g., a SiO$_2$ film, or the piezoelectric thin film, e.g., a LiTaO$_3$ film, may be changed so as to change the higher-order mode acoustic velocity. Alternatively, the acoustic velocity of a wave that propagates through the support substrate made of silicon may be adjusted by changing the crystal orientation of silicon.

That is, at least one of the higher-order mode acoustic velocity and the acoustic velocity V$_{si}$ satisfying formula (1) may be adjusted such that the higher-order mode acoustic velocity of propagation through the piezoelectric film becomes higher than the acoustic velocity V$_{si}$ of the wave that propagates through silicon.

In preferred embodiments of the present invention, it is not always necessary that the dielectric film, e.g., the SiO$_2$ film 3, be provided. In that case, the piezoelectric film is disposed directly on the support substrate 2. In this case as well, a higher-order mode response is able to be reduced or prevented by adjusting the acoustic velocity V$_{si}$ of a wave that propagates through the support substrate 2 made of silicon such that the higher-order mode acoustic velocity becomes higher than the acoustic velocity V$_{si}$. That is, the above-described acoustic velocity V$_{si}$ may be adjusted such that the acoustic velocity V$_{si}$ becomes lower than the higher-order mode acoustic velocity by adjusting the crystal orientation of silicon.

In this regard, as described above, it is preferable that a method in which the higher-order mode acoustic velocity is set to be higher than the acoustic velocity V$_{si}$ by adjusting the film thickness of the SiO$_2$ film so as to control the higher-order mode acoustic velocity be used. Consequently, a higher-order mode response is able to be more effectively reduced or prevented.

In addition, a dielectric film made of a dielectric other than SiO$_2$ may be used.

Figure 7:
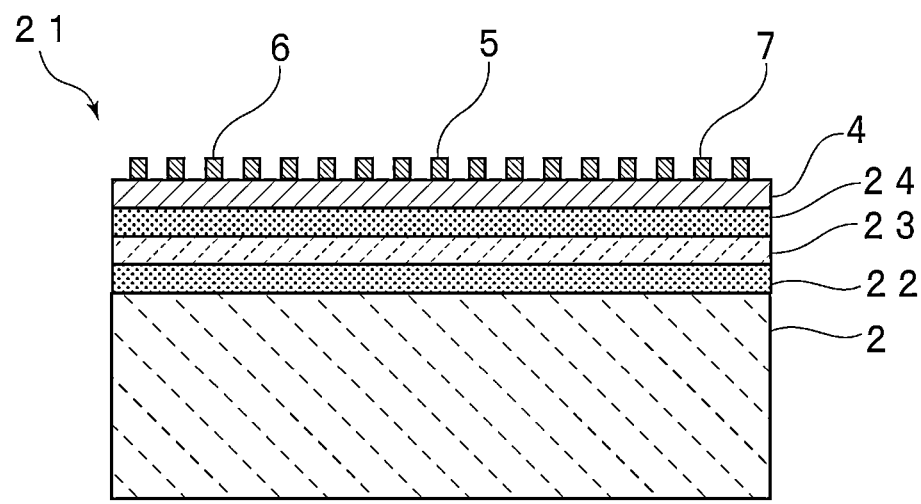
FIG. 7 is a sectional front view showing an elastic wave device according to a modified example of a preferred embodiment of the present invention shown in FIGS. 1A and 1B.

Further, as an elastic wave device 21 according to a modified example of a preferred embodiment of the present invention as shown in FIG. 7, a first low acoustic velocity film 22, a high acoustic velocity film 23, and a second low acoustic velocity film 24 may be provided between the support substrate 2 and the LiTaO$_3$ film 4. The high acoustic velocity film 23 is preferably made of a material through which a bulk wave propagates at an acoustic velocity higher than the acoustic velocity of an elastic wave that propagates through the LiTaO$_3$ film 4. The first low acoustic velocity film 22 and the second low acoustic velocity film 24 are preferably made of a material through which a bulk wave propagates at an acoustic velocity lower than the acoustic velocity of an elastic wave that propagates through the LiTaO$_3$ film 4. There is no particular limitation regarding the materials used for the high acoustic velocity film 23, the first low acoustic velocity film 22, and the second low acoustic velocity film 24 as long as the above-described acoustic velocity relationships are satisfied. In the present modified example, the first low acoustic velocity film 22 and the second low acoustic velocity film 24 are preferably made of SiO$_2$, for example, and the high acoustic velocity film 23 is preferably made of SiN, for example.

In this regard, the first low acoustic velocity film 22 in the elastic wave device 21 may be omitted. That is, the structure in which the high acoustic velocity film 23 and the second low acoustic velocity film 24 are stacked on the support substrate 2 may be provided.

In the above-described preferred embodiment, the one-port elastic wave resonator was described as the elastic wave device 1. However, the elastic wave device according to the present invention is not limited to the one-port elastic wave resonator. The present invention can be widely applied to elastic wave devices having various electrode structures, e.g., a longitudinally coupled resonator-type elastic wave filter.

The material used for the piezoelectric film is not limited to LiTaO$_3$, and materials made of other piezoelectric single crystals, e.g., LiNbO$_3$, or other piezoelectric materials may be used.

Figure 8:
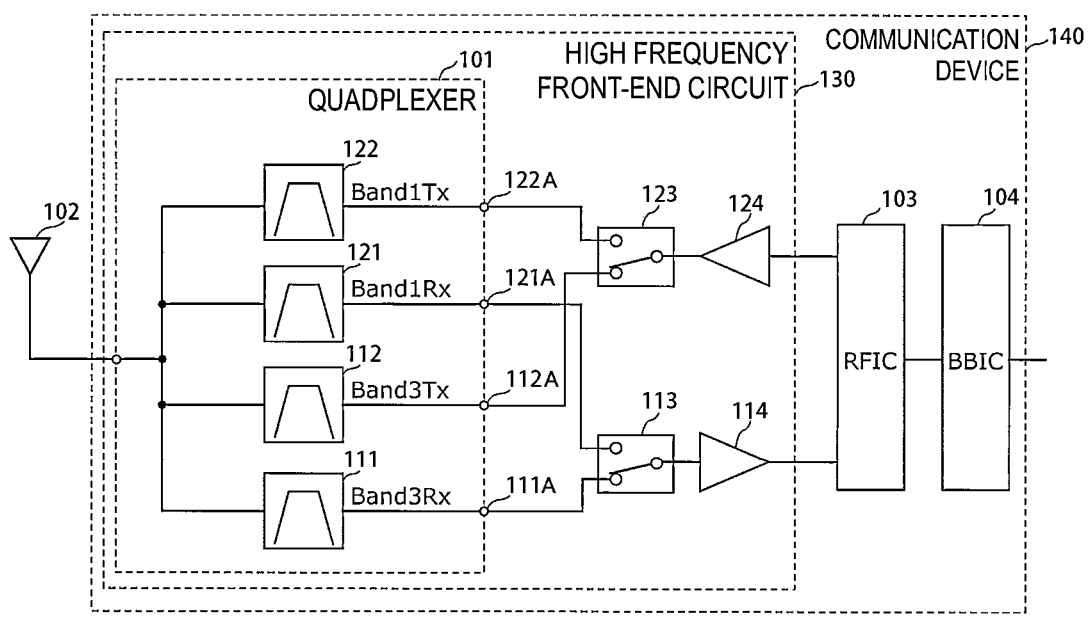
FIG. 8 is a configuration diagram of a high-frequency front-end circuit according to a preferred embodiment of the present invention.

FIG. 8 is a configuration diagram of a high-frequency front-end circuit 130. In this regard, in FIG. 8, each of components (an antenna element 102, an RF signal processing circuit (RFIC) 103, and a base band signal processing circuit (BBIC) 104) that is connected to the high-frequency front-end circuit 130 is also shown. The high-frequency front-end circuit 130, the RF signal processing circuit 103, and the base band signal processing circuit 104 define a communication device 140. The communication device 140 may preferably include a power supply, a CPU, and a display, for example.

The high-frequency front-end circuit 130 includes a quadplexer 101, a receiving switch 113, a sending switch 123, a low noise amplifying circuit 114, and a power amplifying circuit 124. The elastic wave device 1 may preferably define the quadplexer 101 or filters 111, 112, 121, and 122, for example.

The receiving switch 113 is a switch circuit including two selection terminals individually connected to an individual terminal 111A and an individual terminal 121A that are receiving terminals of the quadplexer 101 and a common terminal connected to the low noise amplifying circuit 114.

The sending switch 123 is a switch circuit including two selection terminals individually connected to an individual terminal 112A and an individual terminal 122A that are sending terminals of the quadplexer 101 and a common terminal connected to the power amplifying circuit 124.

Each of the receiving switch 113 and the sending switch 123 connects the common terminal to a signal path corresponding to a predetermined band in accordance with a control signal from a control portion (not shown in the drawing) and is preferably, for example, a SPDT (single pole double throw) switch. The selection terminal connected to the common terminal is not limited to one and may be two or more. That is, the high-frequency front-end circuit 130 may be compatible with carrier aggregation.

The low noise amplifying circuit 114 is a receiving amplifying circuit that amplifies high-frequency signals (i.e., high-frequency received signals), which are received via the antenna element 102, the quadplexer 101, and the receiving switch 113, and output to the RF signal processing circuit 103.

The power amplifying circuit 124 is a sending amplifying circuit that amplifies high-frequency signals (i.e., high-frequency sending signals), which are output from the RF signal processing circuit 103, and outputs to the antenna element 102 via the sending switch 123 and the quadplexer 101.

The RF signal processing circuit 103 subjects high-frequency received signals, which are input from the antenna element 102 through a receiving signal path, to signal processing, e.g., down-conversion, and outputs received signals, which are generated by the signal processing, to the base band signal processing circuit 104. In addition, the RF signal processing circuit 103 subjects sending signals, which are input from the base band signal processing circuit 104, to signal processing, e.g., up-conversion, and outputs high-frequency sending signals, which are generated by the signal processing, to the power amplifying circuit 124. The RF signal processing circuit 103 is preferably, for example, RFIC. The signals processed by the base band signal processing circuit 104 are used as, for example, image signals for image display or voice signals for telephone calls. In this regard, the high-frequency front-end circuit 130 may include other circuit elements between the above-described components.

With the high-frequency front-end circuit 130 and the communication device 140 having the above-described configuration, ripples in a pass band are reduced or prevented by including the quadplexer 101.

The high-frequency front-end circuit 130 may preferably include a quadplexer according to a modified example of the quadplexer 101, instead of the above-described quadplexer 101.

The elastic wave device, the high-frequency front-end circuit, and the communication device according to the preferred embodiments of the present invention have been described with reference to the preferred embodiments and the modified examples thereof. The present invention includes other preferred embodiments that are obtained by combining any components and elements in the above-described preferred embodiments and modified examples, modified examples obtained by applying various modifications, which are conceived by a person skilled in the art, within the scope of the gist of the present invention to the above-described preferred embodiments, and various equipment including the high-frequency front-end circuit or the communication device.

For example, in the above-described preferred embodiments of the present invention and modified examples thereof, the elastic wave device may preferably be the quadplexer or the filter, for example. However, the present invention can also be applied to, for example, multiplexers, e.g., a triplexer in which three filters share an antenna terminal and a hexaplexer in which six filters share an antenna terminal. The multiplexer only needs to include at least two filters.

Further, the multiplexer is not limited to a configuration in which both of the sending filter and the receiving filter are included and may have a configuration in which only the sending filter is included or only the receiving filter is included.

Preferred embodiments of the present invention can be widely used as the multiplexer, which may be applied to a filter and a multiband system, the front-end circuit, and the communication device for communication equipment, e.g., a cellular phone.

The present invention reduces or prevents a higher-order mode that propagates through a piezoelectric film by changing the crystal orientation of a support substrate made of silicon.

Therefore, the higher-order mode described herein refers to any one of modes (types) of waves or a plurality of modes of waves which are generated between about 4,673 m/s and about 5,844 m/s that is the range of the transverse wave acoustic velocity of silicon and which are generated in the higher frequency side than the main mode that propagates through the piezoelectric film.

That is, the higher-order mode that propagates through a piezoelectric film refers to any one of modes (types) of waves or a plurality of modes of waves which are generated in the higher frequency side than the main mode that propagates through the piezoelectric film and which are generated between about 4,673 m/s and about 5,844 m/s that is the range of the transverse wave acoustic velocity of silicon.

For example, when reduction or prevention of the higher-order mode nearest to about 5,844 m/s between about 4,673 m/s and about 5,844 m/s that is the range of the silicon acoustic velocity is intended, this higher-order mode is able to be reduced or prevented by setting the acoustic velocity $V_{si}$ to be lower than or equal to this higher-order mode acoustic velocity.

In addition, when reduction or prevention of all higher-order modes between about 4,673 m/s and about 5,844 m/s is intended, all of the above-described higher-order modes are able to be reduced or prevented by setting the acoustic velocity $V_{si}$ to be lower than or equal to the higher-order mode acoustic velocity nearest to about 4,673 m/s between about 4,673 m/s and about 5,844 m/s.

When the elastic wave device is a resonator, the main mode that propagates through a piezoelectric film refers to a mode of a wave that has the largest difference between the impedance at a resonant frequency and the impedance at an anti-resonant frequency.

When the elastic wave device is a filter, the main mode that propagates through a piezoelectric film refers to a mode of a wave that is used to provide a pass band of the filter.

Then, the higher-order mode that propagates through a piezoelectric film is able to be specified by simulation of a finite element method. Specifically, the film thickness of the interdigital transducer electrode, the material use for the interdigital transducer electrode, the film thickness of the piezoelectric film, the material used for the piezoelectric film, the film thickness of each intermediate layer of the low acoustic velocity film, the high acoustic velocity film, the material used for each intermediate layer, the thickness of the support substrate, and each parameter of the crystal orientation of the support substrate are specified. Thereafter, harmonic vibration analysis is performed using each parameter and simulation software (FEMTET).

Subsequently, the impedance at each frequency is able to be obtained based on the harmonic vibration analysis.

Therefore, from the results of the harmonic vibration analysis, at least one resonant frequency at which the impedance has the local minimum value and at least one anti-resonant frequency at which the impedance has the local maximum value are able to be specified. Then, among them, the mode of a wave that has the largest difference between the impedance at a resonant frequency and the impedance at an anti-resonant frequency is specified. The mode of the wave is the main mode that propagates through the piezoelectric film.

As a result, a higher-order mode (the mode of a wave which is generated in the higher frequency side than the main mode and which is generated between about 4,673 m/s and about 5,844 m/s that is the range of the silicon acoustic velocity) that propagates through the piezoelectric film is able to be specified on the basis of the above-described main mode.

When a plurality of higher-order modes are specified, the mode which has the velocity higher than the acoustic velocity $V_{si}$ and which is nearest to the acoustic velocity $V_{si}$ is assumed to be the higher-order mode.

Then, regarding the higher-order mode acoustic velocity, $V = f \times \lambda$ is satisfied, where the higher-order mode acoustic velocity of propagation through the piezoelectric film is denoted as V, the anti-resonant frequency of the higher-order mode that propagates through the piezoelectric film is denoted as f, and the value that is twice the electrode finger pitch of the interdigital transducer electrode is denoted as $\lambda$.

Therefore, the higher-order mode acoustic velocity V of propagation through the piezoelectric film is able to be determined by multiplying the anti-resonant frequency f of the higher-order mode that propagates through the piezoelectric film by $\lambda$ that is twice the electrode finger pitch of the interdigital transducer electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a support substrate made of silicon;
   a piezoelectric film disposed directly or indirectly on the support substrate; and
   an interdigital transducer electrode disposed on one surface of the piezoelectric film;
   wherein
   the piezoelectric film is made of $LiNbO_3$,
   a higher-order mode acoustic velocity of propagation through the piezoelectric film is equal or substantially equal to an acoustic velocity Vsi denoted by formula (1) or higher than the acoustic velocity Vsi, $$V_{si} = (V_1)^{1/2} \text{ (m/sec)} \qquad \text{formula (1),}$$

in the formula (1), $V_1$ is a solution to formula (2), wherein $$Ax^3 + Bx^2 + Cx + D = 0 \qquad \text{formula (2),}$$

in the formula (2), A, B, C, and D are values denoted by formulae (2A) to (2D), respectively, wherein $$A = -\rho^3 \qquad \text{formula (2A),}$$

$$B = \rho^2 (L_{11} + L_{22} + L_{33}) \qquad \text{formula (2B),}$$

$$C = \rho(L_{21}^2 + L_{23}^2 + L_{31}^2 - L_{11} \cdot L_{33} - L_{22} \cdot L_{33} - L_{11} \cdot L_{22}) \qquad \text{formula (2C),}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \quad \text{formula (2D)},$$

in each of the formula (2A), the formula (2B), the formula (2C), and the formula (2D), p represents a density (g/cm³) of silicon and $L_{11}$, $L_{22}$, $L_{33}$, $L_{21}$, $L_{31}$, and $L_{23}$ are values denoted by formulae (3A) to (3F), respectively, wherein $$L_{11} = c_{11} \cdot a_1^2 + c_{44} \cdot a_2^2 + c_{44} \cdot a_3^2 \quad \text{formula (3A)},$$

$$L_{22} = c_{44} \cdot a_1^2 + c_{11} \cdot a_2^2 + c_{44} \cdot a_3^2 \quad \text{formula (3B)},$$

$$L_{33} = c_{44} \cdot a_1^2 + c_{44} \cdot a_2^2 + c_{11} \cdot a_3^2 \quad \text{formula (3C)},$$

$$L_{21} = (c_{12} + c_{44}) \cdot a_2 \cdot a_1 \quad \text{formula (3D)},$$

$$L_{31} = (c_{12} + c_{44}) \cdot a_1 \cdot a_3 \quad \text{formula (3E)},$$

$$L_{23} = (c_{44} + c_{12}) \cdot a_3 \cdot a_2 \quad \text{formula (3F)},$$

in the formulae (3A) to (3F), each of $c_{11}$, $c_{12}$, and $c_{44}$ is an elastic constant (N/m²) of silicon, and $a_1$, $a_2$, and $a_3$ are values denoted by formulae (4A) to (4C), respectively, wherein $$a_1 = \cos(\phi) \cdot \cos(\varphi) - \sin(\phi) \cdot \cos(\theta) \cdot \sin(\varphi) \quad \text{formula (4A)},$$

$$a_2 = \sin(\phi) \cdot \cos(\varphi) + \cos(\phi) \cdot \cos(\theta) \cdot \sin(\varphi) \quad \text{formula (4B)},$$

$$a_3 = \sin(\theta) \cdot \sin(\varphi) \quad \text{formula (4C)},$$

in the formulae (4A) to (4C), $\phi$, $\theta$, and $\varphi$ represent $\phi$, $\theta$, and $\varphi$ in a crystal orientation $(\phi, \theta, \varphi)$ of silicon.

2. The elastic wave device according to claim 1, wherein V1 in the formula (1) is the solution with a lowest value among the solutions $V_1$, $V_2$, and $V_3$ with respect to the formula (2).

3. The elastic wave device according to claim 1, wherein a film thickness of the piezoelectric film made of LiNbO₃ is within a range of about 0.05λ or more and about 3.5λ or less, where a wavelength of an elastic wave, which is determined in accordance with an electrode finger pitch of the interdigital transducer electrode, is denoted as λ.

4. The elastic wave device according to claim 1, further comprising a dielectric film disposed between the support substrate and the piezoelectric film.

5. The elastic wave device according to claim 4, wherein the dielectric film is made of silicon oxide.

6. The elastic wave device according to claim 5, wherein a film thickness of the dielectric film made of silicon oxide is about 1.2λ or less, where a wavelength of an elastic wave, which is determined in accordance with an electrode finger pitch of the interdigital transducer electrode, is denoted as λ.

7. The elastic wave device according to claim 6, wherein the film thickness of the dielectric film made of silicon oxide is about 0.6λ or less.

8. The elastic wave device according to claim 1, further comprising:
a high acoustic velocity film which is disposed between the support substrate and the piezoelectric film and through which a bulk wave propagates at an acoustic velocity higher than an acoustic velocity of an elastic wave that propagates through the piezoelectric film; and
a low acoustic velocity film which is stacked on the high acoustic velocity film and through which a bulk wave propagates at an acoustic velocity lower than the acoustic velocity of an elastic wave that propagates through the piezoelectric film.

9. The elastic wave device according to claim 8, wherein the high acoustic velocity film is made of silicon nitride.

10. A high-frequency front-end circuit comprising:
the elastic wave device according to claim 1; and
a power amplifier.

11. A communication device comprising:
the high-frequency front-end circuit according to claim 10;
an RF signal processing circuit; and
a base band signal processing circuit.

12. An elastic wave device comprising:
a support substrate made of silicon;
a piezoelectric film disposed on the support substrate;
a dielectric film disposed between the support substrate and the piezoelectric film; and
an interdigital transducer electrode disposed on one surface of the piezoelectric film; wherein
the piezoelectric film is made of LiNbO₃,
a film thickness of the piezoelectric film is within a range of about 0.05λ or more and about 3.5λ or less, where a wavelength of an elastic wave, which is determined in accordance with an electrode finger pitch of the interdigital transducer electrode, is denoted as λ,
the dielectric film is made of silicon oxide, and
a film thickness of the dielectric film is about 1.2λ or less.

13. The elastic wave device of claim 12, wherein the film thickness of the dielectric film made of silicon oxide is about 0.6λ or less.

14. The elastic wave device of claim 13, wherein the film thickness of the dielectric film made of silicon oxide is about 0.4λ or less.

* * * * *